United States Patent
Xin-LeBlanc et al.

(10) Patent No.: US 6,859,083 B1
(45) Date of Patent: Feb. 22, 2005

(54) CIRCUITS FOR REDUCING LEAKAGE CURRENTS IN PULL-UP AND PULL-DOWN CIRCUITS USING VERY SMALL MOSFET DEVICES

(75) Inventors: Jane Xin-LeBlanc, Santa Clara, CA (US); Wai Lau, Taikoo Shing (HK)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/630,322

(22) Filed: Jul. 30, 2003

(51) Int. Cl.[7] .................................................. H03L 5/00
(52) U.S. Cl. ........................................ 327/309; 327/327
(58) Field of Search ................................. 327/309, 313, 327/318, 321, 327, 328, 427, 434, 436

(56) References Cited

U.S. PATENT DOCUMENTS

| | | | | |
|---|---|---|---|---|
| 4,956,691 A | * | 9/1990 | Culley et al. ................ | 257/369 |
| 5,726,588 A | * | 3/1998 | Fiedler ......................... | 326/63 |
| 5,748,025 A | * | 5/1998 | Ng et al. ...................... | 327/333 |
| 5,834,948 A | * | 11/1998 | Yoshizaki et al. ............. | 326/81 |
| 6,211,704 B1 | * | 4/2001 | Kong ........................... | 326/121 |
| 6,262,593 B1 | * | 7/2001 | Sobelman et al. ............ | 326/35 |
| 6,538,466 B1 | * | 3/2003 | Lovett ........................... | 326/31 |

* cited by examiner

*Primary Examiner*—Timothy P. Callahan
*Assistant Examiner*—Cassandra Cox

(57) ABSTRACT

A pull-down circuit for pulling a high-impedance node to ground when a pull-down (PD) signal driving the pull-down circuit is Logic 1. The pull-down circuit comprises: 1) a first pull-down N-channel transistor having a drain coupled to the high-impedance node, a gate coupled to the PD signal, and a source coupled to a common node; 2) a second pull-down N-channel transistor having a drain coupled to the common node, a gate coupled to the PD signal, and a source coupled to a ground rail;, wherein the first and second pull-down N-channel transistors are off when the PD signal is Logic 0 and are on when the PD signal is Logic 1; and 3) a gate-biasing circuit driven by the PD signal. The gate-biasing circuit is off when the PD signal is Logic 1 and the gate-biasing circuit applies a Logic 1 bias voltage to the common node when the PD signal is Logic 0. The Logic 1 bias voltage creates a negative Vgs bias on the first pull-down N-channel transistor when the PD signal is Logic 0. An analogous pull-up circuit also is disclosed.

10 Claims, 4 Drawing Sheets

CIRCUITS FOR REDUCING LEAKAGE CURRENTS IN PULL-UP AND PULL-DOWN CIRCUITS USING VERY SMALL MOSFET DEVICES

CROSS-REFERENCE TO RELATED APPLICATIONS

The present invention is related to those disclosed in:

1) U.S. patent application Ser. No. 10/630,311, filed concurrently herewith, entitled "CIRCUITRY FOR REDUCING LEAKAGE CURRENTS IN A PRE-CHARGE CIRCUIT USING VERY SMALL MOSFET DEVICES;" and 2) U.S. patent application Ser. No. 10/630,504, filed concurrently herewith, entitled "CIRCUITRY FOR REDUCING LEAKAGE CURRENTS IN A TRANSMISSION GATE SWITCH USING VERY SMALL MOSFET DEVICES."

U.S. patent application Ser. Nos. 10/630,311 and 10/630,504 are commonly assigned to the assignee of the present invention. The disclosures of the related patent applications are hereby incorporated by reference for all purposes as if fully set forth herein.

TECHNICAL FIELD OF THE INVENTION

The present invention is generally directed to analog circuits that are fabricated using small feature-sized MOSFET processes and, in particular, to a circuit that reduces sub-threshold leakage currents in small MOSFET devices connected to sensitive analog circuit nodes.

BACKGROUND OF THE INVENTION

As the feature size of MOSFET processes shrink, the MOSFET sub-threshold drain-to-source leakage current when the transistor is supposedly turned off becomes increasingly large. In analog circuits where it is critical for a node to stay at high impedance, this increased leakage current may no longer be ignored. When the devices connected to the high impedance node draw large enough leakage currents, the performance of the circuit may suffer significantly. For instance, in a phase-locked loop (PLL), the devices connected to the high-impedance node of the loop filter may draw enough current when the devices are supposedly off to cause jitter in the PLL output.

Therefore, there is a need in the art for improved analog circuits that are fabricated using small feature-sized MOSFET processes. In particular, there is a need for circuits that reduce the sub-threshold leakage currents in small MOSFET devices connected to sensitive analog circuit nodes.

SUMMARY OF THE INVENTION

Low leakage current versions of three commonly used analog switches are shown to demonstrate techniques of reducing MOSFET sub-threshold leakage currents which can be significant in modern small-feature-sized CMOS processes. These circuits may be coupled to the high-impedance node of a phase-locked loop (PLL), for example. The three circuits include 1) pull-up/pull-down devices, 2) a pre-charge circuit, and 3) a transmission switch (T-switch) for analog testing. It should be noted that the low leakage current designs disclosed herein are general purpose and are not necessarily limited to PLL designs.

To address the above-discussed deficiencies of the prior art, it is a primary object of the present invention to provide, for use with an operational circuit comprising at least one high-impedance node, a pull-down circuit capable of pulling the high-impedance node down to ground when a pull-down (PD) signal driving the pull-down circuit is Logic 1. According to an advantageous embodiment of the present invention, the pull-down circuit comprises: 1) a first pull-down N-channel transistor having a drain coupled to the high-impedance node, a gate coupled to the PD signal, and a source coupled to a common node; 2) a second pull-down N-channel transistor having a drain coupled to the common node, a gate coupled to the PD signal, and a source coupled to a ground rail;, wherein the first and second pull-down N-channel transistors are off when the PD signal is Logic 0 and are on when the PD signal is Logic 1; and 3) a gate-biasing circuit driven by the PD signal, wherein the gate-biasing circuit is off when the PD signal is Logic 1 and the gate-biasing circuit applies a Logic 1 bias voltage to the common node when the PD signal is Logic 0, the Logic 1 bias voltage creating a negative Vgs bias on the first pull-down N-channel transistor when the PD signal is Logic 0.

According to another embodiment of the present invention, the gate-biasing circuit comprises a P-channel transistor having a gate coupled to the PD signal, a drain coupled to the common node, and a source coupled to a VDD power supply rail.

According to still another embodiment of the present invention, the gate-biasing circuit comprises: 1) an inverter having an input coupled to the PD signal; and 2) a biasing N-channel transistor having a gate coupled to an output of the inverter, a source coupled to the common node, and a drain coupled to a VDD power supply rail.

It is another primary object of the present invention to provide, for use with an operational circuit comprising at least one high-impedance node, a pull-up circuit capable of pulling the high-impedance node up to a high voltage when a pull-up (PU*) signal driving the pull-up circuit is Logic 0. According to an advantageous embodiment of the present invention, the pull-up circuit comprises: 1) a first pull-up P-channel transistor having a drain coupled to the high-impedance node, a gate coupled to the PU* signal, and a source coupled to a common node; a second pull-up P-channel transistor having a drain coupled to the common node, a gate coupled to the PU* signal, and a source coupled to a VDD power supply rail, wherein the first and second pull-up P-channel transistors are off when the PU* signal is Logic 1 and are on when the PU* signal is Logic 0; and a gate-biasing circuit driven by the PU* signal, wherein the gate-biasing circuit is off when the PU* signal is Logic 0 and the gate-biasing circuit applies a Logic 0 bias voltage to the common node when the PU* signal is Logic 1, the Logic 0 bias voltage creating a positive Vgs bias on the first pull-up P-channel transistor when the PU* signal is Logic 1.

In another embodiment of the present invention, the gate-biasing circuit comprises a biasing N-channel transistor having a gate coupled to the PU* signal, a drain coupled to the common node, and a source coupled to a ground power rail.

In still another embodiment of the present invention, the gate-biasing circuit comprises: 1) an inverter having an input coupled to the PU* signal; and 2) a biasing P-channel transistor having a gate coupled to an output of the inverter, a source coupled to the common node, and a drain coupled to a ground power rail.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged small feature-sized MOSFET device.

Figure 1:
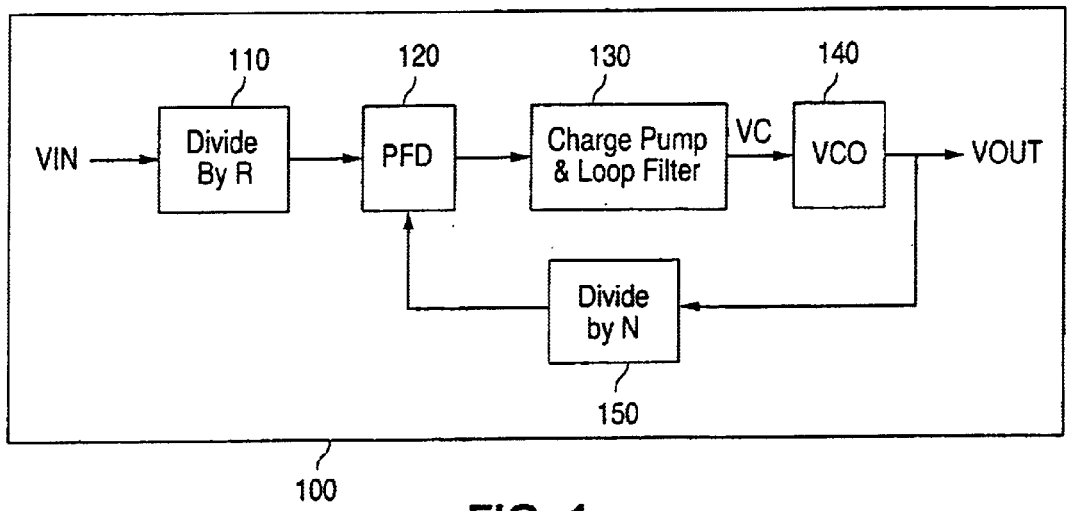
FIG. 1 illustrates an exemplary phase-locked loop (PLL) that incorporates commonly used analog switches in which MOSFET sub-threshold leakage currents are reduced according to the principles of the present invention.

FIG. 1 illustrates exemplary phase-locked loop (PLL) 100, which incorporates commonly used analog switches in which MOSFET sub-threshold leakage currents are reduced according to the principles of the present invention. PLL 100 comprises frequency divider 110, phase-frequency detector 120, charge pump and loop filter circuit 130, voltage controlled oscillator 140 and frequency divider 160. Frequency divider 110 divides the frequency of the input signal, VIN, by R, where R may be an integer of a fractional value. Frequency divider 150 divides the frequency of the output signal, VOUT, by N, where N may be an integer or a fractional value.

PFD 120 receives and compares the frequency-divided reference signal from frequency divider 110 and the frequency-divided feedback signal from frequency divider 150. Depending on whether the frequency of the feedback signal is greater than or less than the frequency of the reference signal, PFD 130 generates either a Pump Up signal or a Pump Down signal that is applied to charge pump and loop filter 130. If a Pump Up signal is received, charge pump and loop filter 130 adds charge to the loop filter, which is typically a large storage capacitor. If a Pump Down signal is received, charge pump and loop filter 130 discharges the loop filter. The voltage on the loop filter is the control voltage, VC, at the output of charge pump and loop filter 130.

Voltage-controlled oscillator 140 produces the output signal, VOUT, which has a frequency that is controlled by the control voltage, CV. As the CV voltage increases, the frequency of the VOUT output signal increases. As the CV voltage decreases, the frequency of the VOUT output signal decreases. Thus, through the operation of the negative feedback path in PLL 150, the frequency of the VOUT output signal is held at some multiple of the frequency of the VIN input signal, where the multiple is determined by the values of R and N of frequency dividers 110 and 150, respectively.

Figure 2A:
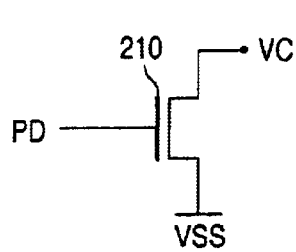
FIG. 2A illustrates a conventional pull-down circuit according to an exemplary embodiment of the prior art.

FIG. 2A illustrates conventional pull-down circuit 210 according to an exemplary embodiment of the prior art. Pull-down circuit 210 comprises. N-channel transistor 210, which has a gate coupled to the pull-down signal, PD, a drain coupled to the VC node at the output of charge pump and loop filter 130, and a source coupled to the VSS power rail (e.g., ground rail). According to the exemplary embodiment, N-channel transistor 210 is a metal-oxide-silicon field effect transistor (MOSFET).

The VC node at the output of charge pump and loop filter 130 is a high impedance node. When the pull-down signal, PD, is at Logic 1, N-channel transistor 210 is turned on, thereby pulling the node VC to ground. This discharges the loop filter capacitor. When PD is Logic 0, N-channel transistor 210 is off and should not have any measurable effect on the PLL operation. If reality, however, if N-channel transistor 210 is made from a small-feature-sized CMOS process, the sub-threshold drain-to-source leakage current (Ids) when N-channel transistor 210 is off is no longer negligible. As a result, even if Vgs of N-channel transistor 210 is zero volts (0 V), Ids of N-channel transistor 210 could be on the order of hundreds of nano-amperes. In the case of PLL 100, is this non-zero leakage current drains significant charge from the loop filter capacitor even when the PD signal is Logic 0, thereby causing unacceptably large amounts of jitter at the output of PLL 100.

Figure 2B:
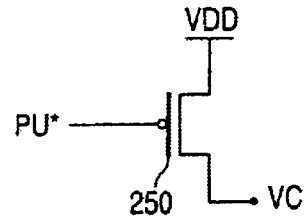
FIG. 2B illustrates a conventional pull-up circuit according to an exemplary embodiment of the prior art.

FIG. 2B illustrates conventional pull-up circuit 250 according to an exemplary embodiment of the prior art. Pull-up circuit 250 comprises P-channel transistor 250, which has a gate coupled to the pull-up signal, PU*, a drain coupled to the VC node at the output of charge pump and loop filter 130, and a source coupled to the VDD power supply rail. According to the exemplary embodiment, P-channel transistor 250 is a metal-oxide-silicon field effect transistor (MOSFET). The pull-up signal, PU* is an active low signal.

The VC node at the output of charge pump and loop filter 130 is a high impedance node. When the pull-up signal, PU*, is at Logic 0, P-channel transistor 250 is turned on, thereby pulling the node VC up to the. VDD rail voltage. This charges the loop filter capacitor. When PU* is Logic 1, P-channel transistor 250 is off and should not have any measurable effect on the PLL operation. If reality, however, if P-channel transistor 250 is made from a small-feature-sized CMOS process, the sub-threshold drain-to-source leakage current (Ids) when P-channel transistor 250 is off is no longer negligible. As a result, even if Vgs of P-channel transistor 250 is zero volts (0 V), Ids of P-channel transistor 250 could be on the order of hundreds of nano-amperes. In the case of PLL 100, this non-zero leakage current adds significant charge to the loop filter capacitor even when the PU* signal is Logic 1, thereby causing unacceptably large amounts of jitter at the output of PLL 100.

Figure 3A:
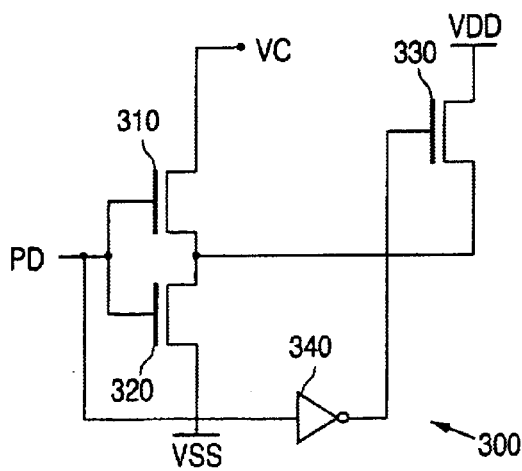
FIG. 3A illustrates a pull-down circuit according to an exemplary embodiment of the present invention.

FIG. 3A illustrates pull-down circuit 300 according to an exemplary embodiment of the present invention. Pull-down circuit 300 comprises N-channel transistors 310, 320 and 330, and inverter 340. The gates of N-channel transistors 310 and 320 are coupled to the pull-down signal, PD. The drain of N-channel transistor 310 is coupled to the VC node at the output of charge pump and loop filter 130. The source of N-channel transistor 310 is coupled to the drain of N-channel transistor 320. The source of N-channel transistor 320 is coupled to the VSS power rail (e.g., ground rail).

The input of inverter 340 is coupled to the pull-down signal, PD. The output of inverter 340 drives the gate of N-channel transistor 330. The drain of N-channel transistor 330 is coupled to the VDD power supply rail. The source of N-channel transistor 330 is coupled to the drain of N-channel transistor 320.

Pull-down circuit 300 performs the same function as the circuit in FIG. 2A, without the leakage problem. When the pull-down signal, PD, is Logic 1, N-channel transistors 310 and 320 are turned on, thereby pulling the VC node at the output of charge pump and loop filter 130 to ground. Also, when PD is Logic 1, N-channel transistor 330 is turned off and does nothing. It is noted the widths of N-channel transistors 310 and 320 are twice the width of N-channel transistor 210 in order to maintain the same pull-down impedance.

When the PD pull-down signal is Logic 0, N-channel transistors 310 and 320 are both off. At the same time, N-channel transistor 330 is turned on, thereby pulling the source of N-channel transistor 310 and the drain of N-channel transistor 320 up to the VDD rail (i.e., Logic 1). As a result, the Vgs voltage of N-channel transistor 310 is negative, rather than merely 0 volts. This is a "hard" shut-off that effectively reduces the sub-threshold leakage current of N-channel transistor 310 to a negligible amount, thereby avoiding leakage problems.

Other circuit designs may be used to create a negative Vgs voltage bias on N-channel transistor 310. For example, in an alternate embodiment of the present invention, N-channel transistor 330 and inverter 340 may be replaced by a single P-channel transistor that has a gate coupled to the PD input signal, a source coupled to the VDD power supply rail, and a drain coupled to the source of N-channel transistor 310.

Figure 3B:
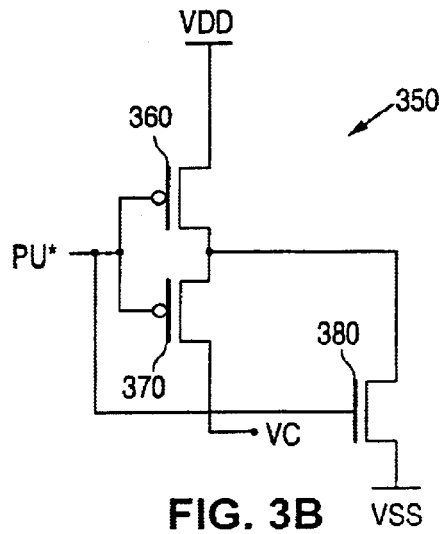
FIG. 3B illustrates a pull-up circuit according to an exemplary embodiment of the present invention

FIG. 3B illustrates pull-up circuit 350 according to an exemplary embodiment of the present invention. Pull-up circuit 350 comprises P-channel transistors 360 and 370, and N-channel transistor 380. The gates of P-channel transistors 360 and 370 are coupled to the pull-up signal, PU*. The drain of P-channel transistor 370 is coupled to the VC node at the output of charge pump and loop filter 130. The source of P-channel transistor 370 is coupled to the drain of P-channel transistor 360. The source of P-channel transistor 360 is coupled to the VDD power supply rail.

The pull-up signal, PU* also drives the gate of N-channel transistor 380. The source of N-channel transistor 380 is coupled to the VSS supply rail (i.e., ground). The drain of N-channel transistor 380 is coupled to the common node at the drain of P-channel transistor 360 and the source of P-channel transistor 370.

Pull-up circuit 350 performs the same function as the circuit in FIG. 2B, without the leakage problem. When the pull-up signal, PU*, is Logic 0, P-channel transistors 360 and 370 are turned on, thereby pulling the VC node at the output of charge pump and loop filter 130 up to the VDD supply voltage. Also, when PU* is Logic 0, N-channel transistor 380 is turned off and does nothing. It is noted the widths of P-channel transistors 360 and 370 are twice the width of P-channel transistor 250 in order to maintain the same pull-up impedance.

When the pull-up signal, PU*, is Logic 1, P-channel transistors 360 and 370 are both off. At the same time, N-channel transistor 380 is turned on, thereby pulling the source of P-channel transistor 370 and the drain of P-channel transistor 360 down to ground (i.e., Logic 1). As a result, the Vgs voltage of P-channel transistor 370 is positive, rather than merely 0 volts. This is a "hard" shut-off that effectively reduces the sub-threshold leakage current of P-channel transistor 370 to a negligible amount, thereby avoiding leakage problems.

Other circuit designs may be used to create a positive Vgs voltage bias on P-channel transistor 310. For example, in an alternate embodiment of the present invention, N-channel transistor 380 may be replaced by an inverter that is driven by the PU* pull-down signal and a single P-channel transistor that has a gate coupled to the output of the inverter. The P-channel transistor would also have a drain coupled to the VSS power supply rail, and a source coupled to the source of P-channel transistor 370.

Figure 4:
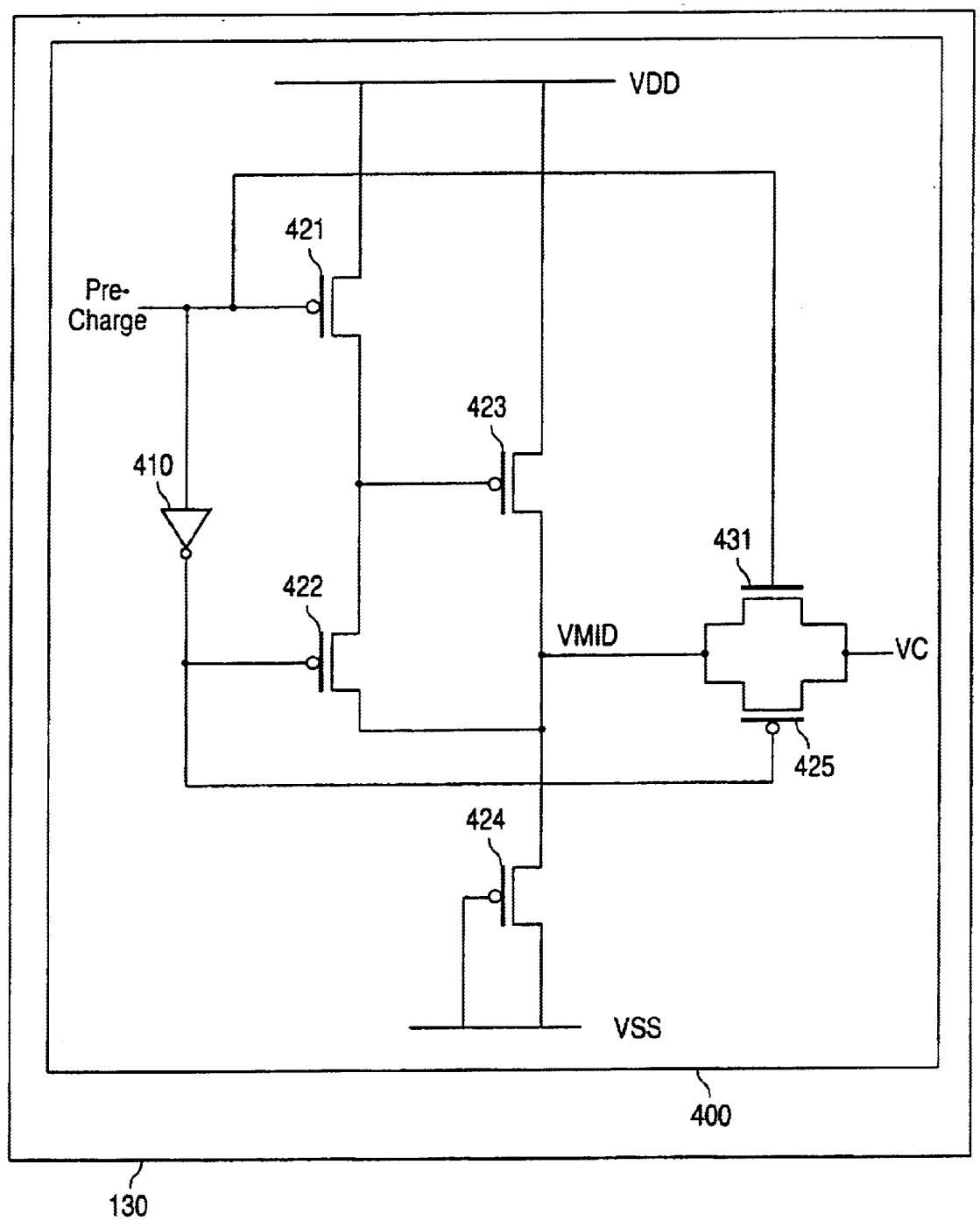
FIG. 4 illustrates a conventional pre-charge circuit according to an exemplary embodiment of the prior art.

FIG. 4 illustrates conventional pre-charge circuit 400 in exemplary charge pump and loop filter 130 according to an exemplary embodiment of the prior art. Pre-charge circuit 400 comprises P-channel transistors 421–425, N-channel transistor 431, and inverter 410. P-channel transistor 425 and N-channel transistor 431 form a transmission gate switch. When the Pre-Charge input signal is at Logic 1, pre-charge circuit 400 is enabled and P-channel transistor 425 and N-channel transistor 431 are both on. When the Pre-Charge input signal is at Logic 0, pre-charge circuit 400 is disabled and P-channel transistor 425 and N-channel transistor 431 are both off.

When Pre-Charge=1, P-channel transistor 421 is off and P-channel transistor 422 is on. When Pre-Charge=0, P-channel transistor 421 is on and P-channel transistor 422 is off. P-channel transistor 423 and P-channel transistor 424 are connected as diodes (i.e., Vgd=0). It is noted that the gate and drain of P-channel transistor 424 are directly connected together (i.e., Vgd=0 always) and the gate and drain of P-channel transistor 423 are shorted together when P-channel transistor 422 is on (i.e., Vgd=0 when Pre-Charge=1). Because P-channel transistor 423 and P-channel transistor 424 are the same type and size devices and are connected in series between the VDD rail and the VSS rail (i.e., ground), the voltage, VMID, at the drain of P-channel transistor 422 is VDD/2.

When Pre-Charge=1, the transmission gate switch formed by P-channel transistor 425 and N-channel transistor 431 is on (i.e., closed), thereby shorting the VMID node to the VC node. This drives the high-impedance VC node to approximately VDD/2. When Pre-Charge=0, the transmission gate switch is off, thereby isolating the VMID node from the VC node. Also, when Pre-Charge=0, P-channel transistor 422 is off and P-channel transistor 421 is on, thereby shorting the gate of P-channel transistor 423 to the VDD rail. Since the source of P-channel transistor 421 also is connected to the VDD rail, the Vgs for P-channel transistor 423 is zero and P-channel transistor 423 is off. This cuts off current flow through P-channel transistor 423 and P-channel transistor 424.

Unfortunately, pre-charge circuit 400 experiences high leakage current when pre-charge circuit 400 is disabled. When Pre-Charge=0, P-channel transistor 423 is off, but P-channel transistor 424 is still on Thus, the VMID node sits at approximately 0 volts. Since Pre-charge=0 is coupled to the gate of N-channel transistor 431 and VMID=0 is coupled to the source of N-channel transistor 431, the Vgs of N-channel transistor 431 is approximately 0 volts. This permits sub-threshold leakage currents in small-feature-sized processes. Therefore, a leakage current path forms between the high impedance node, VC, and the VSS rail (i.e., ground) through N-channel transistor 431 and P-channel transistor 424.

Figure 5:
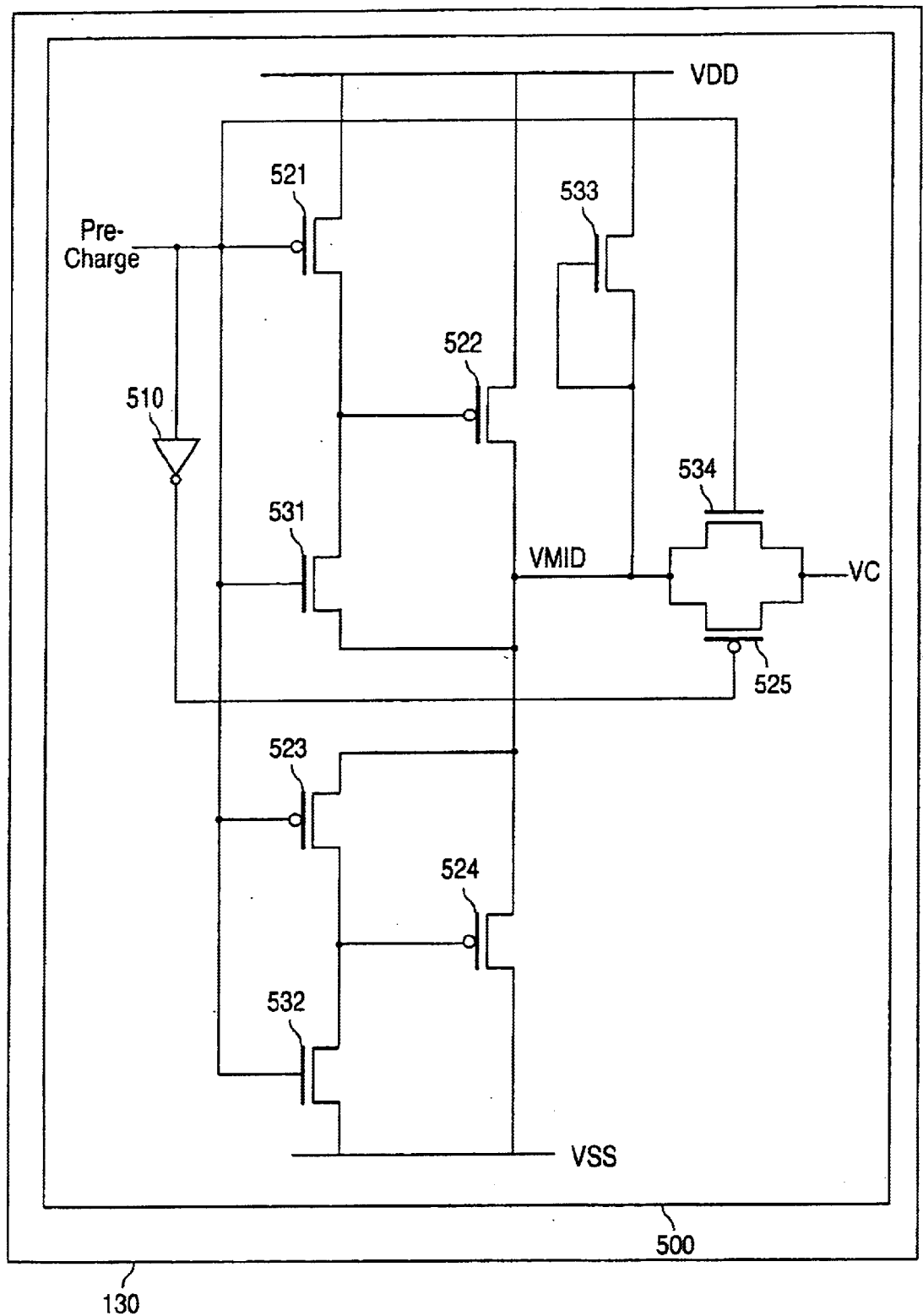
FIG. 5 illustrates a pre-charge circuit according to an exemplary embodiment of the present invention.

FIG. 5 illustrates pre-charge circuit 500 in exemplary charge pump and loop filter 130 according to an exemplary embodiment of the present invention. Pre-charge circuit 500 comprises P-channel transistors 521–525, N-channel transistors 531–534, and inverter 510. P-channel transistor 525 and N-channel transistor 534 form a transmission gate switch. When the Pre-Charge input signal is at Logic 1, pre-charge circuit 500 is enabled and P-channel transistor 525 and N-channel transistor 534 are both on. When the Pre-Charge input signal is at Logic 0, pre-charge circuit 500 is disabled and P-channel transistor 525 and N-channel transistor 534 are both off.

When Pre-Charge=1, P-channel transistors 521 and 523 are off and N-channel transistors 531 and 532 are on. When Pre-Charge=0, P-channel transistors 521 and 523 are on and N-channel transistors 531 and 532 are off. When Pre-Charge=1, P-channel transistor 522 and P-channel transistor 524 are connected as diodes (i.e., Vgd=0). The gate and drain of P-channel transistor 522 are shorted together when N-channel transistor 531 is on (i.e., Vgd=0 when Pre-charge=1). Similarly, the gate and drain of P-channel transistor 524 are shorted together when N-channel transistor 532 is on (i.e., Vgd=0 when Pre-Charge=1). Because P-channel transistor 522 and P-channel transistor 524 are the same type and size devices and are connected in series between the VDD rail and the VSS rail (i.e., ground), the voltage, VMID, at the drain of P-channel transistor 522 is VDD/2.

The gate and source of N-channel transistor 533 are connected together, so that N-channel transistor 533 is off all the time. N-channel transistor 533 has negligible effect when P-channel transistors 522 and 524 are on. However, when Pre-Charge=0, P-channel transistors 521 and 523 are on and N-channel transistors 531 and 532 are off. Since P-channel transistors 521 and 523 are both on, the gate-to-source voltages (Vgs) of P-channel transistors 522 and 524 are both 0 volts. Therefore, P-channel transistors 522 and 524 are off.

Because P-channel transistors 522 and 524 are the same type and size devices, the impedances of P-channel transistors 522 and 524 are approximately the same when P-channel transistors 522 and 524 are off. When pre-charge circuit 500 is in this state, N-channel transistor 533 is off, but has a Vgs of zero volts and therefore has a sub-threshold leakage current. It is noted that when Pre-Charge=0, P-channel transistor 523 is on and shorts the VMID node to the drain of N-channel transistor 532, which is off. However, N-channel transistor 532 still has a sub-threshold leakage current that can discharge the VMID node through P-channel transistor 523. Therefore, N-channel transistor 533 is introduced to cancel the leakage current of N-channel transistor 532. In this way, the VMID node sits at approximately VDD/2. Note the size of N-channel transistor 533 is larger than the size of N-channel transistor 532 in order to compensate for the body effect of N-channel transistor 533 when an n-well process is used.

The source of N-channel transistor 534 is coupled to the VMID node and the drain of N-channel transistor 534 is coupled to the VC node. The source of P-channel transistor 525 is coupled to the VMID node and the drain of P-channel transistor 525 is coupled to the VC node. When the VMID node is at VDD/2, the sub-threshold leakage currents of both N-channel transistor 534 and P-channel transistor 525 are negligible because N-channel transistor 534 and P-channel transistor 525 are both "hard" off. That is, the Vgs bias of N-channel transistor 534 is negative (i.e., −VDD/2) and the Vsg bias of P-channel transistor 525 is positive (i.e., +VDD/2).

Figure 6:
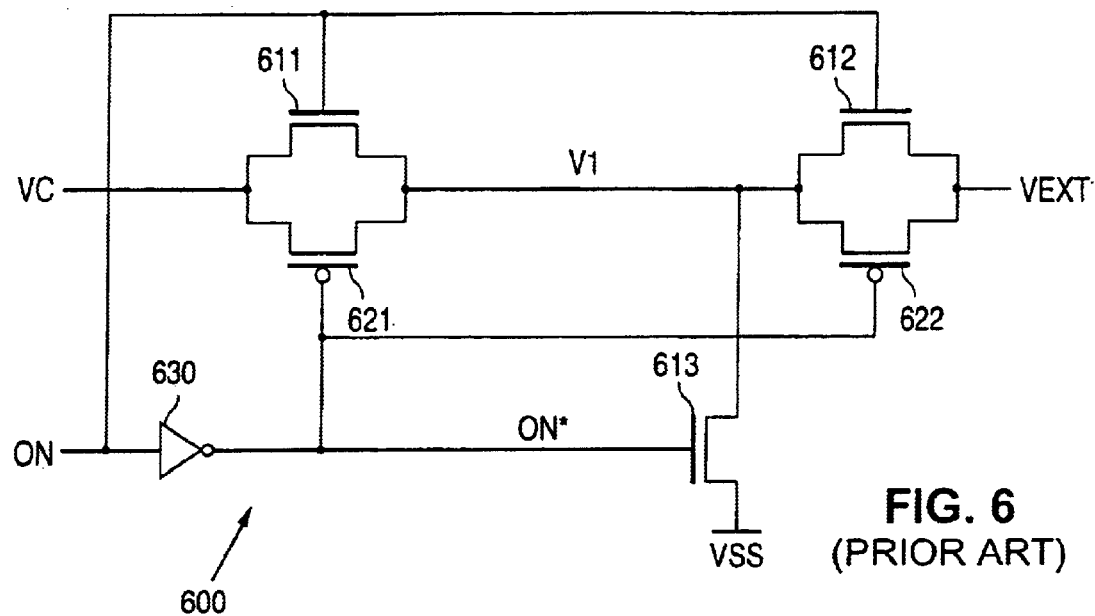
FIG. 6 illustrates a conventional test circuit according to an exemplary embodiment of the prior art.

FIG. 6 illustrates conventional test circuit 600 according to an exemplary embodiment of the prior art. For measurement purposes, test circuit 600 transmits the voltage at an internal node (the VC voltage in this case) to an externally accessible test point, namely the input/output (I/O) pad VEXT. Test circuit 600 comprises N-channel transistors 611–613, P-channel transistors 621 and 622, and inverter 630. N-channel transistor 611 and P-channel transistor 621 form a first transmission gate switch. N-channel transistor 612 and P-channel transistor 622 form a second transmission gate switch. N-channel transistor 613 operates as a pull-down device.

When the ON signal is Logic 1, N-channel transistors 611 and 612 are on, P-channel transistors 621 and 622 are on, and N-channel transistor 613 is off. Since both transmission gates are on, the VC node is shorted to the VEXT node. This allows the user to either monitor or drive the internal analog node, VC. When the ON is Logic 0, both transmission switches are off and N-channel transistor 613 is on and pulls the V1 node between the transmission switches to ground. This is done to minimize potential interferences from the VEXT external node to internal node VC via capacitive couplings. As in the cases of pull-down circuit 210 and pre-charge circuit 400, a sub-threshold leakage current path exists from the VC to ground through N-channel transistor 611 and N-channel transistor 613 when test circuit 600 is off.

Figure 7:
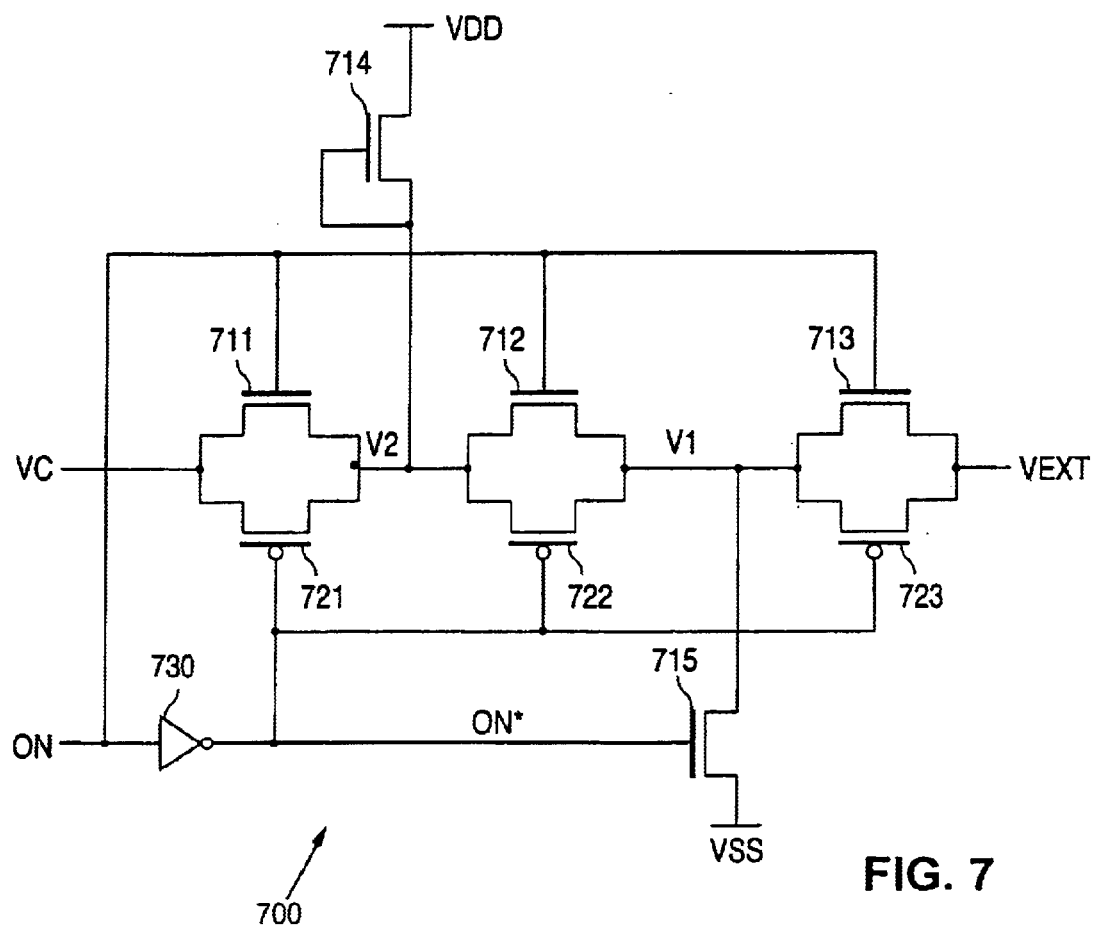
FIG. 7 illustrates a test circuit according to an exemplary embodiment of the present invention.

FIG. 7 illustrates test circuit 700 according to an exemplary embodiment of the present invention. For measurement purposes, test circuit 700 transmits the voltage at an internal node (the VC voltage in this case) to an externally accessible test point, namely the input/output (I/O) pad VEXT. Test circuit 700 comprises N-channel transistors 711–715, P-channel transistors 721–723, and inverter 730. N-channel transistor 711 and P-channel transistor 721 form a first transmission gate switch. N-channel transistor 712 and P-channel transistor 722 form a second transmission gate switch. N-channel transistor 713 and P-channel transistor 723 form a third transmission gate switch. N-channel transistor 715 operates as a pull-down device. The gate and source of N-channel transistor 714 are coupled together (i.e., Vgs=0), so that N-channel transistor 714 is always off.

However, N-channel transistor 714 has a sub-threshold leakage current when Vgs=0.

When the ON signal is Logic 1, all three transmission gate switches are on, allowing test circuit 700 to function in a manner similar to test circuit 600. However, the switch sizes in test circuit 700 are 50% larger than those in test circuit 600 to maintain the same on-resistance. When the ON signal is Logic 0, all three transmission gate switches are off. The V1 node is pulled down to ground by N-channel transistor 715, keeping interference low.

However, the sub-threshold leakage current path is eliminated in test circuit 700. N-channel transistor 712 is still leaky because its Vgs is 0 volts. However, N-channel transistor 714 is also leaky and has approximately the same impedance as N-channel transistor 712. So the voltage at the V2 node is approximately VDD/2 when the V1 node is pulled down to ground. It is noted that the size of N-channel transistor 714 is bigger than the size of N-channel transistor 712 to compensate for the body effect. Because the V2 node is at VDD/2 when the V1 node is at ground and the ON signal is Logic 0, N-channel transistor 711 and P-channel transistor are "hard" off (i.e., Vgs<0 for N-channel transistor 711 and Vgs>0 for P-channel transistor 721). Hence, there is a negligible amount of leakage current and no leaky path is connected to the VC node.

The above-described circuits can be used to reduce sub-threshold leakage currents in small-feature-sized CMOS processes. All three circuits involve leaky switches when the Vgs values of the MOSFET devices are 0 volts (i.e., when the switches are off). The new circuit designs modify the prior art circuits such that the leakage paths are eliminated by making Vgs<0 for the N-channel devices and Vgs>0 for the P-channel devices. This is accomplished without impacting circuit performances or affecting power consumption.

Although the present invention has been described with an exemplary embodiment, various changes and modifications may be suggested to one skilled in the art. It is intended that the present invention encompass such changes and modifications as fall within the scope of the appended claims.

What is claimed is:

1. For use with an operational circuit comprising at least one high-impedance node, a pull-down circuit capable of pulling said high-impedance node down to ground when a pull-down (PD) signal driving said pull-down circuit is Logic 1, said pull-down circuit comprising:

a first pull-down N-channel transistor having a drain coupled to said high-impedance node, a gate coupled to said PD signal, and a source coupled to a common node;

a second pull-down N-channel transistor having a drain coupled to said common node, a gate coupled to said PD signal, and a source coupled to a ground rail;, wherein said first and second pull-down N-channel transistors are off when said PD signal is Logic 0 and are on when said PD signal is Logic 1; and a gate-biasing circuit driven by said PD signal, wherein said gate-biasing circuit is off when said PD signal is Logic 1 and said gate-biasing circuit applies a Logic 1 bias voltage to said common node when said PD signal is Logic 0, said Logic 1 bias voltage creating a negative Vgs bias on said first pull-down N-channel transistor when said PD signal is Logic 0.

2. The pull-down circuit as set forth in claim 1 wherein said gate-biasing circuit comprises a P-channel transistor having a gate coupled to said PD signal, a drain coupled to said common node, and a source coupled to a VDD power supply rail.

3. The pull-down circuit as set forth in claim 2 wherein said operational circuit is a phase-locked loop (PLL).

4. The pull-down circuit as set forth in claim 1 wherein said gate-biasing circuit comprises:

an inverter having an input coupled to said PD signal; and a biasing N-channel transistor having a gate coupled to an output of said inverter, a source coupled to said common node, and a drain coupled to a VDD power supply rail.

5. The pull-down circuit as set forth in claim 4 wherein said operational circuit is a phase-locked loop (PLL).

6. For use with an operational circuit comprising at least one high-impedance node, a pull-up circuit capable of pulling said high-impedance node up to a high voltage when a pull-up (PU*) signal driving said pull-up circuit is Logic 0, said pull-up circuit comprising:

a first pull-up P-channel transistor having a drain coupled to said high-impedance node, a gate coupled to said PU* signal, and a source coupled to a common node;

a second pull-up P-channel transistor having a drain coupled to said common node, a gate coupled to said PU* signal, and a source coupled to a VDD power supply rail, wherein said first and second pull-up P-channel transistors are off when said PU* signal is Logic 1 and are on when said PU* signal is Logic 0; and a gate-biasing circuit driven by said PU* signal, wherein said gate-biasing circuit is off when said PU* signal is Logic 0 and said gate-biasing circuit applies a Logic 0 bias voltage to said common node when said PU* signal is Logic 1, said Logic 0 bias voltage creating a positive Vgs bias on said first pull-up P-channel transistor when said PU* signal is Logic 1.

7. The pull-up circuit as set forth in claim 6 wherein said gate-biasing circuit comprises a biasing N-channel transistor having a gate coupled to said PU* signal, a drain coupled to said common node, and a source coupled to a ground power rail.

8. The pull-up circuit as set forth in claim 7 wherein said operational circuit is a phase-locked loop (PLL).

9. The pull-up circuit as set forth in claim 6 wherein said gate-biasing circuit comprises:

an inverter having an input coupled to said PU* signal; and a biasing P-channel transistor having a gate coupled to an output of said inverter, a source coupled to said common node, and a drain coupled to a ground power rail.

10. The pull-up device as set forth in claim 9 wherein said operational circuit is a phase-locked loop (PLL).

* * * * *

UNITED STATES PATENT AND TRADEMARK OFFICE
CERTIFICATE OF CORRECTION

PATENT NO. : 6,859,083 B1
DATED : February 22, 2005
INVENTOR(S) : Jane Xin-LeBlanc and Wai Lau It is certified that error appears in the above-identified patent and that said Letters Patent is hereby corrected as shown below:

<u>Column 4,</u>
Line 34, delete "." after "comprises";

<u>Column 5,</u>
Line 4, delete "." after "the";

<u>Column 7,</u>
Line 16, insert -- . -- after "on".

Signed and Sealed this

Sixth Day of June, 2006

JON W. DUDAS
*Director of the United States Patent and Trademark Office*